(12) United States Patent
Miyanaga et al.

(10) Patent No.: US 6,337,235 B1
(45) Date of Patent: Jan. 8, 2002

(54) SEMICONDUCTOR DEVICE AND MANUFACTURING METHOD THEREOF

(75) Inventors: Akiharu Miyanaga; Toru Mitsuki, both of Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/534,152

(22) Filed: Mar. 24, 2000

(30) Foreign Application Priority Data

Mar. 26, 1999 (JP) .......................................... 11-084865

(51) Int. Cl.⁷ .......................... H01L 21/76; B08B 6/00; C11D 3/02; C11D 7/02
(52) U.S. Cl. ........................ 438/166; 438/799; 134/1.2; 134/1.3; 510/175
(58) Field of Search ................................ 438/166, 471, 438/476, 799; 134/1.2, 1.3; 510/175

(56) References Cited

U.S. PATENT DOCUMENTS

| 5,594,569 A | 1/1997 | Konuma et al. | |
|---|---|---|---|
| 5,643,826 A | 7/1997 | Ohtani et al. | |
| 5,846,921 A | * 12/1998 | Gil et al. | 510/175 |
| 5,923,962 A | 7/1999 | Ohtani et al. | |

FOREIGN PATENT DOCUMENTS

| EP | 0 651 431 | 3/1995 |
|---|---|---|
| EP | 0 651 431 A2 | 5/1995 |
| JP | 07/130652 | 5/1995 |
| JP | 409064052 A * | 3/1997 |
| JP | 11-133463 | 5/1999 |

OTHER PUBLICATIONS

Specifications and Drawings for Application Serial No. 09/473,936, "Method for Manufacturing a Semiconductor Device", Date: Dec. 28, 1999.

Furue et al., "Characteristics and Driving Scheme of Polymer–Stabilized Monostable FLCD Exhibiting Fast Response Time and High Contrast Ration with Gray–Scale Capability", SID 98 DIGEST, pp. 782–785.

Yoshida et al., "A Full–Color Thresholdless Antiferroelectric LCD Exhibiting Wide Viewing Angle with Fast Response Time", SID 97 DIGEST, pp. 841–844.

Inui et al., "Thresholdless Antiferroelectricity in liquid crystals and its application to displays", J. Mater. Chem., 1996, 6(4), pp. 671–673.

* cited by examiner

Primary Examiner—John F. Niebling
Assistant Examiner—Viktor Simkovic
(74) Attorney, Agent, or Firm—Nixon Peabody LLP; Jeffrey L. Costellia

(57) ABSTRACT

The object of the present invention is to develop a manufacturing process for fabricating thin film transistors by using a crystalline semiconductor film appropriately for the purpose, in which the crystalline semiconductor film is formed by using a catalyst which enables crystallization at a low temperature and is easily gettered.

Low temperature crystallization is realized by introducing Cu, a catalyst, on the amorphous semiconductor film and performing a heat treatment. Cu is gettered by immersing the polycrystalline semiconductor film which slightly includes Cu into a chemical fluid selected from a group consisting of a chemical including oxygen namely sulfuric acid. nitric acid, oxalic acid and nitrohydrochloric acid, and a chemical not including oxygen namely hydrochrolic acid and hydrofluoric acid

32 Claims, 12 Drawing Sheets

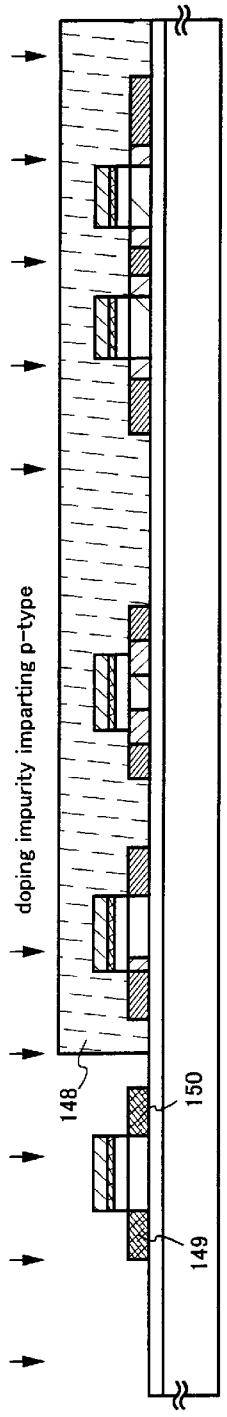
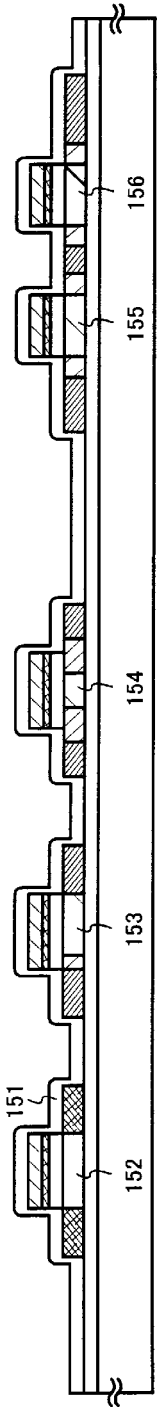
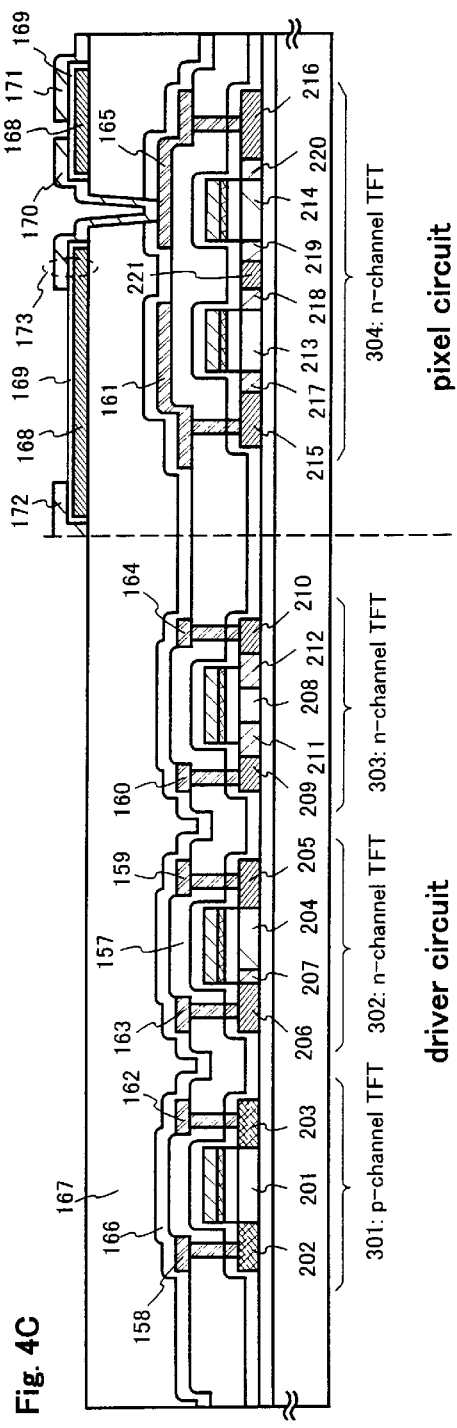

Fig. 11A
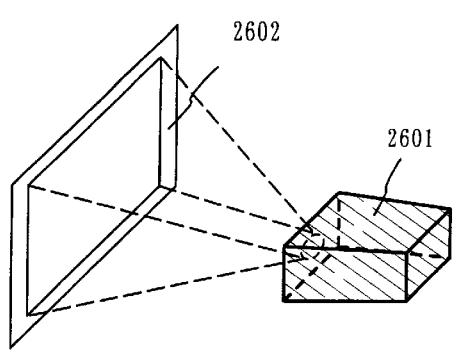
Fig. 11B
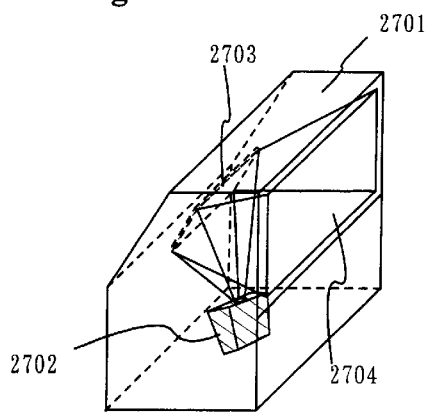
Fig. 11C projection device (3-plate type)
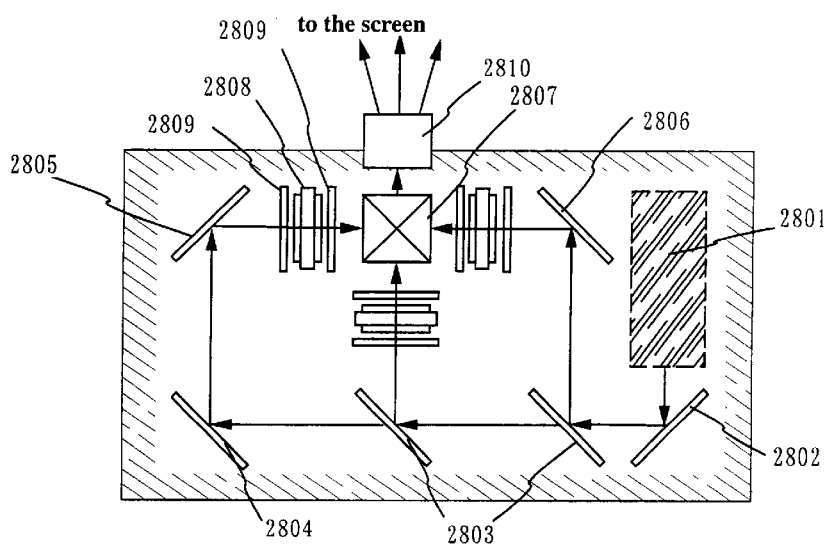
Fig. 11D optical light source system
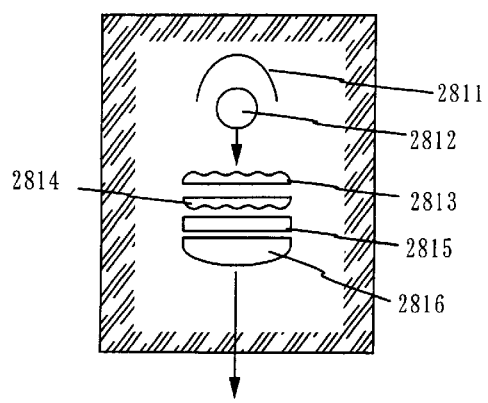

SEMICONDUCTOR DEVICE AND MANUFACTURING METHOD THEREOF

BACKGROUND OF THE INVENTION

1. Field of the Invention

The present invention relates to a semiconductor device having a circuit structured by a thin film transistor (hereinafter referred to as a TFT) on a substrate having an insulating surface, and a method of manufacturing the semiconductor device. In particular, the present invention relates a formation method of a crystalline semiconductor film used as an active layer of a TFT. Note that in this specification, a semiconductor device indicates a general device functioning by utilizing semiconductor characteristics, and semiconductor devices include electro-optical devices and electronic equipment loaded with an electro-optical device.

2. Description of the Related Art

The development of semiconductor devices having a large surface area integrated circuit formed by TFTs on a substrate having an insulating surface has been advancing. Active matrix type liquid crystal display devices, EL display devices, and contact type image sensors are known as typical examples of such. In particular, a TFT (hereinafter, a polysilicon TFT is used as a typical example) in which a crystalline semiconductor film (typically a polysilicon film) is made into an active layer has a high electric field effect mobility, and therefore it is possible to use it to form many kinds of function circuits.

For example, in an active matrix type liquid crystal display device, integrated circuits such as the following are formed on one substrate for each functional block: a pixel circuit for performing image display; and a shift register circuit based on CMOS circuits; a level shifter circuit; a buffer circuit; and a sampling circuit. Further, driver circuits for controlling a pixel circuit, such as a sample hold circuit, a shift register circuit, and a multiplexer circuit, are formed in a contact type image sensor using a TFT. Therefore, depending upon their usage objective, a high degree of element performance is required for TFTs.

The performance of the polysilicon TFT largely follows the characteristics of the polysilicon film used as an active layer. Therefore, the manufacture of a good quality polysilicon film by a simple process is of great importance in the manufacturing process of the polysilicon TFT.

The polysilicon film used in the active layer is normally formed by the crystallization, through some method, of an amorphous silicon film. Specifically, this is performed by a process such as laser irradiation, lamp annealing using an infrared light, or furnace annealing with an electric furnace. Of these, when crystallization is performed by electric furnace heat treatment, normally a high temperature of 600° C. or greater is necessary. Note that below 600° C., crystallization is extremely slow, and is impractical.

However, if the process temperature is high, then it is necessary to use a high cost material such as quartz for the substrate, and there is a disadvantage in which the costs become high. Therefore, a technique of crystallization at a rather low temperature is required. For this end, it is effective to use catalytic elements which promote crystallization. For example, it is disclosed in Japanese Patent Application Laid-Open No. Hei 7-130652 (corresponding to U.S. Pat. No. 5,643,826) that low temperature crystallization is possible by doping a catalyst, typically Ni, into the amorphous silicon film.

However, a harmful affect may be imparted to the TFT performance when Ni remains within the active layer. Gettering is then necessary by some type of method after crystallization is completed. Methods such as a method of doping phosphorous at a high concentration outside the region which becomes a channel and then moving Ni in a horizontal direction by heat treatment, and a method of drawing out the catalyst in the liquid phase by immersion in hot sulfuric acid can be considered as gettering methods.

SUMMARY OF THE INVENTION

However, the above method have the following problems: a relatively long heat treatment time is necessary for gettering the Ni by using phosphorous, and the gettering efficiency by the liquid phase method with sulfuric acid is insufficient, resulted in a problem for the process. Thus an object of the present invention is the development of a process in which a polysilicon film is formed using a catalyst that is easily gettered, and with which crystallization can be made at a low temperature to manufacture a desired polysilicon TFT using the polysilicon film.

In order to solve the above problems, according to an aspect of the present invention, the gettering of the Cu within the semiconductor film is performed by the steps of:

introducing a Cu catalyst into an amorphous semiconductor film by performing spin coating of a solution containing Cu on the amorphous semiconductor film;

polycrystallizing the amorphous semiconductor film by heat treatment in an electric furnace; and immersing the completed polycrystalline semiconductor film, containing a small amount of Cu, into at least one chemical solution selected from the following chemical solutions: a chemical solution containing oxygen (such as sulfuric acid, nitric acid, oxalic acid, or aqua regia), and a chemical solution which does not contain oxygen (such as hydrochloric acid or hydrofluoric acid).

Further, an aqueous solution of copper chloride ($CuCl_2$) dissolved in dilute hydrochloric acid is used as the solution containing Cu in the above process. The Cu concentration when used is from 1 to 1000 ppm by weight, and hydrochloric acid is between 0.01 and 0.1%.

Furthermore, a metallic Cu thin film may be formed by a method such as sputtering in the above process as a substitute for spin coating the solution on the amorphous semiconductor film.

BRIEF DESCRIPTION OF THE DRAWINGS

In the accompanying drawings:

FIGS. 4A–4C show the manufacturing processes of the pixel section and the driver circuit.

FIGS. 11A–11D show an example of electronic devices.

DETAILED DESCRIPTION OF THE PREFERRED EMBODIMENTS

The preferred embodiments of the present invention are explained in detail by the embodiments shown below.

Embodiment 1

Embodiment 1 of the present invention is explained using FIGS. 1A to 5. A method of manufacturing polysilicon TFTs of a pixel circuit at the same time, and driver circuits formed in the periphery of the pixel circuit, using the above stated method of forming a polycrystalline semiconductor film is explained here. However, in order to simplify the explanation, a CMOS circuit that is the basic circuit of circuits such as a shift register circuit and a buffer circuit, and an n-channel TFT forming a sampling circuit, are shown in the driver circuits.

Figure 1A:
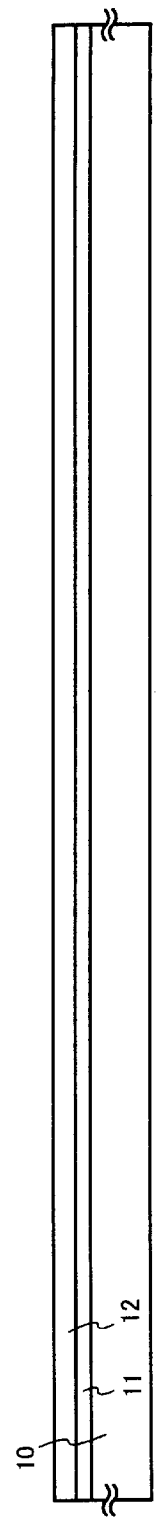
FIG. 1A–1D show the manufacturing processes of the pixel section and the driver circuit.
Figure 1B:
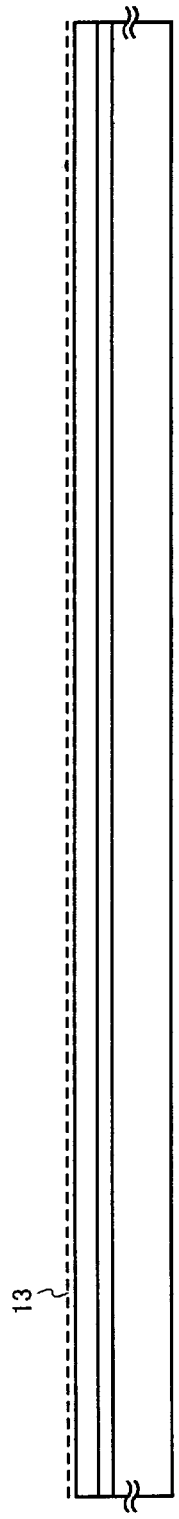
Figure 1C:
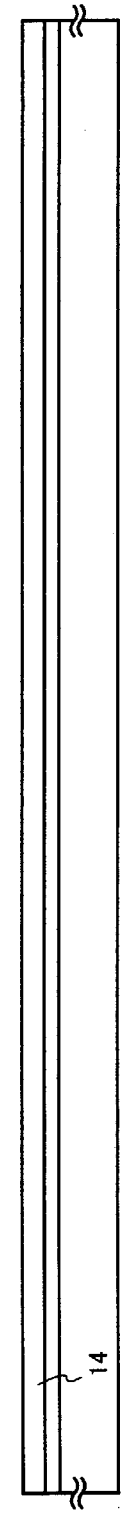
Figure 1D:
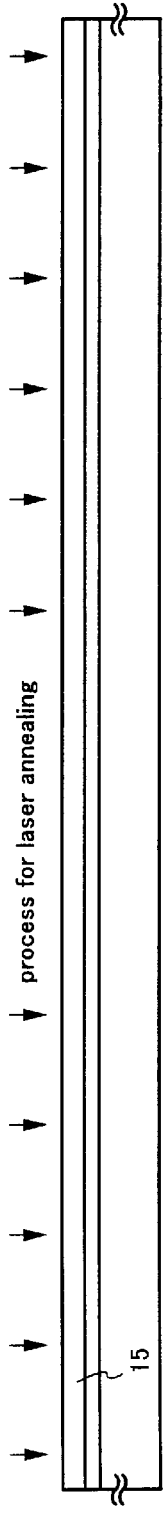
Figure 2A:
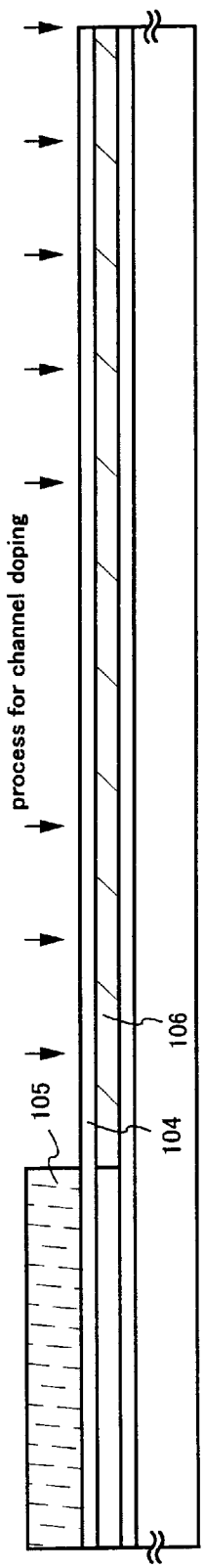
FIGS. 2A–2D show the manufacturing processes of the pixel section and the driver circuit.
Figure 2B:
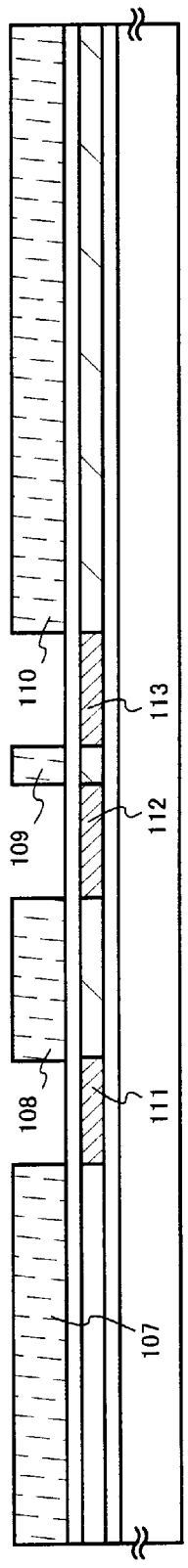
Figure 2C:
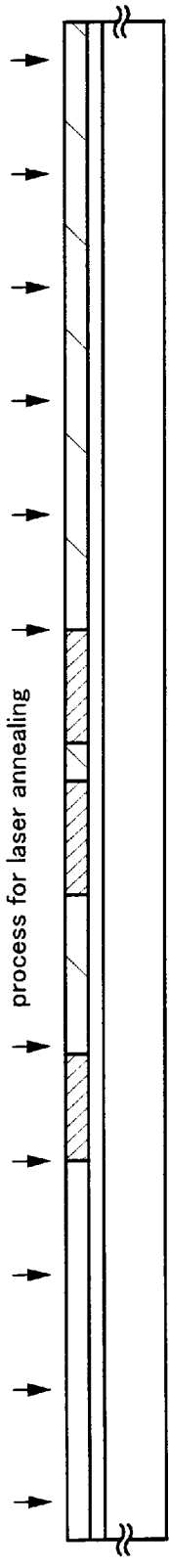
Figure 2D:
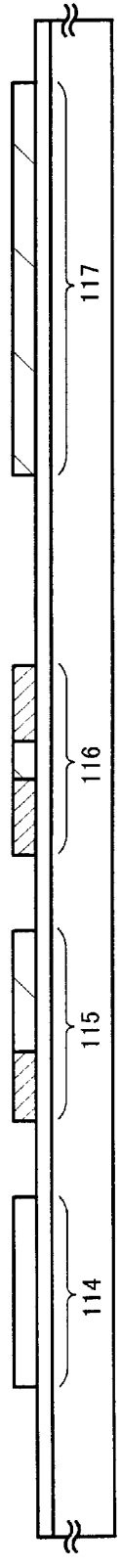

In FIG. 1A, it is preferable to use a glass substrate or a quartz substrate as a substrate 10. In addition, one may also be used as a substrate, having an insulating film formed on the surface of a silicon substrate, a metallic substrate, or a stainless steel substrate. Depending on its heat resistance, it is also possible to use a plastic substrate.

A base film 11 made from an insulating film containing silicon (that indicates a generic term of a silicon oxide film, a silicon nitride film, or a silicon nitride oxide film throughout this specification) is formed by plasma CVD or sputtering to a thickness of between 100 and 400 nm on the surface of the substrate 10 on which the TFTs are formed. Note that a silicon nitride oxide film is an insulating film denoted by $SiO_xN_y$ (where 0<x, and y <1) and indicates an insulating film containing silicon, oxygen, and nitrogen at a predetermined ratio. Further, the silicon nitride oxide film may be manufactured by with $SiH_4$, $N_2O$, and $NH_3$ as raw material gasses, and that it is good if the film contains a nitrogen concentration of between 25 atomic % and 50 atomic %.

A two layer structure of a 25 to 100 nm thick silicon nitride oxide film, a thickness of 50 nm here, and a 50 to 300 nm thick silicon oxide film, a thickness of 150 nm here, is used in embodiment 1 as the base film 11. The base film 11 is formed in order to prevent impurity contamination from the substrate, and it is not always necessary to form the base film 11 when a quartz substrate is used.

A semiconductor film 12 containing an amorphous structure (an amorphous silicon film in embodiment 1) is then formed to a thickness of from 20 to 100 nm on the base film 11 by a known film deposition method. Note that the semiconductor films containing an amorphous structure include an amorphous semiconductor film and a microcrystalline semiconductor, and in addition, include a compound semiconductor film containing an amorphous structure, such as an amorphous silicon germanium film.

A semiconductor film containing a crystalline structure (a crystalline silicon film in embodiment 1) is then formed in accordance with the technique described in Japanese Patent Application Laid-Open No. Hei 7-130652 (corresponding to U.S. Pat. No. 5,643,826). The technique described in this publications is a means of crystallization using a catalytic element (a single or plural kinds of elements chosen from among nickel, cobalt, germanium, tin, lead, palladium, iron, and copper, typically nickel) promoting crystallization when the amorphous silicon film is crystallized. From among these catalytic elements, copper is used in embodiment 1.

Specifically, heat treatment is performed in a state in which Cu is maintained in the surface of the amorphous silicon film, and the amorphous silicon film is made into a crystalline silicon film. An aqueous copper chloride solution 13 is contacted with the surface of the amorphous silicon film, from which a natural oxidation film is removed in advance, by spinning, and then dried. Note that an aqueous solution of diluted hydrochloric acid is used. A solution with a 100 ppm by weight Cu concentration and a 0.035% by weight hydrochloric acid concentration is used. (See FIG. 1B.) Further, so-called single crystal silicon films and poly-silicon films are included in crystalline silicon films, but the crystalline silicon film formed in embodiment 1 is a silicon film having crystal grain boundaries.

It is preferable to perform a dehydrogenating process by heat treatment for several hours desirably at between 400 and 550° C., although it depends upon the amount of hydrogen contained within the amorphous silicon film, reducing the amount of contained hydrogen to 5 atom % or less and then performing the crystallization step. Furthermore, although the amorphous silicon film may be formed by another manufacturing method such as sputtering or evaporation, it is preferable to sufficiently reduce the amount of impurity elements such as oxygen and nitrogen contained within the film.

It is possible to form the base film and the amorphous silicon film by the same film deposition method here, and therefore they both may be formed in succession. It becomes possible to prevent surface contamination by not exposing the substrate to the atmosphere forming the base film, and dispersion in the characteristics of the manufactured TFTs can be reduced.

Next, after removing in advance a thin oxide film which is formed on the surface during crystallization, the small amount of Cu which exists within the crystalline silicon film is removed by immersing the substrate into sulfuric acid heated to 280° C. A crystalline silicon film 14 having very high purity is thus obtained. (See FIG. 1C.) This is a phenomenon which originates in a getting effect of a metallic element due to hot sulfuric acid, and as a result, the Cu concentration within the crystalline silicon film becomes $1\times10^{17}$ atoms/cm$^3$ or less (preferably $1\times10^{16}$ atoms/cm$^3$ or less).

Light emitted from a laser light source (laser light) is then irradiated to the crystalline silicon film 14 (this is hereinafter referred to as laser annealing), forming a crystalline silicon film 15 which has improved crystallinity. It is preferable to use pulse oscillation type, or continuous oscillation type, excimer laser light, but continuous oscillation type argon laser light may also be used. Further, the beam shape of the laser light may be a linear shape or a rectangular shape. (See FIG. 1D.)

In addition, light emitted from a lamp (lamp light) may be irradiated as a substitute for laser light (this is hereinafter referred to as lamp annealing). Lamp light emitted from a source such as a halogen lamp or an infrared lamp can be used for the lamp light.

Note that a process in which heat treatment (annealing) is performed in this way by using laser light or lamp light is called a light annealing process. High temperature heat treatment is performed in a short time by a light annealing process, and therefore it is an effective heat treatment process for cases when a substrate with low heat resistance, such as a glass substrate, is used, and it can be performed at a high throughput. Of course, annealing is the goal, and therefore furnace annealing (also called thermal annealing) using an electric furnace can also be substituted.

A laser annealing process is performed with pulse oscillation type excimer laser light processed into a linear shape in embodiment 1. The laser annealing conditions are: XeCl gas is used as the excitation gas; the process temperature is room temperature; the pulse oscillation frequency is set to 30 Hz; and the laser energy density is set to between 250 and 500 mJ/cm$^2$ (typically from 350 to 400 mJ/cm$^2$).

The laser annealing process performed with the above conditions has the effects of completely crystallizing amorphous regions remaining after thermal crystallization, and at the same time reducing defects in crystalline regions already crystallized. Therefore, this process can also be called a process to improve semiconductor film crystallization by light annealing, or a process to promote crystallization of the semiconductor film. It is possible to obtain these effects by optimizing the lamp annealing conditions. These conditions are called first annealing conditions throughout this specification.

A protection film 104 is next formed on the crystalline silicon film 15 for later doping of impurities. A silicon nitride oxide film or a silicon oxide film with a thickness of from 100 to 200 nm (preferably from 130 to 170 nm) is used for the protection film 104. The protection film 104 is formed so that the crystalline silicon film is not exposed directly to the plasma during impurity doping, and so that delicate control of concentration is possible.

A resist mask 105 is then formed on the protection film 104, and an impurity element imparting p-type conductivity (hereinafter referred to as a p-type impurity element) is doped through the protection film 104. Periodic table group 13 elements, typically boron or gallium, can be used as the p-type impurity element. This process (called a channel doping process) is for controlling the TFT threshold voltage. Note that boron is doped here by plasma excited ion doping without mass separation of diborane ($B_2H_6$). Of course, an ion implantation method which performs mass separation may also be used.

An impurity region 106 containing a p-type impurity element (boron in embodiment 1) at a concentration of between $1\times10^{15}$ and $1\times10^{18}$ atoms/cm$^3$ (typically from $5\times10^{16}$ to $5\times10^{17}$ atoms/cm$^3$) is formed by this process. Note that an impurity region containing a p-type impurity element at least within the above concentration range is defined as a p-type impurity region (b) throughout this specification. (See FIG. 2A.)

The resist mask 105 is removed next, and new resist masks 107 to 110 are formed. An impurity element imparting n-type conductivity (hereinafter referred to as an n-type impurity element) is then doped, forming impurity regions 111 to 113 with n-type conductivity. Note that a periodic table group 15 element, typically phosphorous or arsenic, can be used as the n-type impurity element. (See FIG. 2B.)

These low concentration impurity regions 111 to 113 are impurity regions which later function as LDD regions in the n-channel TFT of the CMOS circuit and the sampling circuit. Note that the n-type impurity element is contained in the impurity regions formed here at a concentration of between $2\times10^{16}$ and $5\times10^{19}$ atoms/cm$^3$, (typically between $5\times10^{17}$ and $5\times10^{18}$ atoms/cm$^3$). Note that an impurity region containing an n-type impurity element within the above concentration range is defined as an n-type impurity region (b) throughout this specification.

Phosphorous is doped here to a concentration of $1\times10^{18}$ atoms/cm$^3$ by plasma excited ion doping without mass separation of phosphine ($PH_3$). Of course, an ion implantation method which performs mass separation may also be used. Phosphorous is doped through the protection film 104 into the crystalline silicon film.

The protective film 104 is removed next, and a laser light irradiation process is again performed. Use of pulse oscillation type, or continuous oscillation type, excimer laser light is also preferable here for the laser light, but continuous oscillation type argon laser light may also be used. Further, the beam shape of the laser light may be a linear shape or a rectangular shape. However, the objective is the activation of the doped impurity element, and therefore it is preferable to irradiate with an energy level at which the crystalline silicon film does not melt. Further, it is possible to perform laser annealing process with the protective film 104 in place. (See FIG. 2C.)

Laser annealing process is performed in embodiment 1 by processing pulse oscillation type excimer laser light into a linear shape. The laser annealing conditions are: KrF gas is used as the excitation gas; the process temperature is room temperature; the pulse oscillation frequency is set to 30 Hz; and the laser energy density is set to between 100 and 300 mJ/cm$^2$ (typically from 150 to 250 mJ/cm$^2$).

The laser annealing process performed with the above conditions has the effects of activating the doped impurity elements which impart n-type conductivity or p-type conductivity, and at the same time recrystallizing the amorphous semiconductor film during impurity element doping. Note that the above conditions are preferable to give consistency to the atomic arrangement without melting of the semiconductor film and to activate the impurity elements. Further, this process can be called a process to activate n-type or p-type conductivity imparting impurity elements, a process to recrystallize the semiconductor film, or a process to perform both of these at the same time. It is possible to obtain these effects by optimizing the lamp annealing conditions. These conditions are called second annealing conditions throughout this specification.

The boundaries of the n-type impurity regions (b) 111 to 113 are defined by this process. In other words, the junctions of the n-type impurity regions (b) 111 to 113 with intrinsic regions (p-type impurity regions (b) are regarded as sufficiently intrinsic) existing around the n-type impurity regions (b) are clarified. This means that the LDD regions and the channel forming regions will be formed with exceptionally good junctions when the TFTs are later completed.

Note that activation by heat treatment may also be used when performing impurity element activation by laser light. Considering the heat resistance of the substrate, heat treatment may be performed approximately at a temperature of from 450 to 550° C. for cases in which activation is performed by heat treatment.

Unnecessary portions of the crystalline silicon film are next removed, forming island shape semiconductor films (hereinafter referred to as active layers) 114 to 117. (See FIG. 2D.)

A gate insulating film 118 is then formed, covering the active layers 114 to 117. The gate insulating film 118 may be formed with a thickness of from 10 to 200 nm, preferably between 50 and 150 nm. A 115 nm thick silicon nitride oxide film is formed by plasma CVD with $N_2O$ and $SiH_4$ as raw materials in embodiment 1. (See FIG. 3A.)

A conductive film which becomes a gate wiring is formed next. Note that a single layer conductive film may be formed for the gate wiring, but when necessary, a laminate film of two or three layers may preferably be formed. A laminate film of a first conductive film 119 and a second conductive film 120 is formed in embodiment 1. (See FIG. 3B.) The following can be used as the first conductive film 119 and the second conductive film 120: an element selected from among tantalum (Ta), titanium (Ti), molybdenum (Mo), tungsten (W), chromium (Cr), and silicon (Si); a conductive film having one of the above elements as its principal constituent (typically a tantalum nitride film, a tungsten nitride film, or a titanium nitride film); and an alloy film of a combination of the above elements (typically a Mo—W alloy or a Mo—Ta alloy).

Note that the first conductive film 119 may be formed with a thickness of between 10 and 50 nm (preferably from 20 to 30 nm), and the second conductive film 120 may be formed with a thickness of between 200 and 400 nm (preferably from 250 to 350 nm). A 50 nm thick tungsten nitride (WN) film is used as the first conductive film 119, and a 350 nm thick tungsten film is used as the second conductive film 120 in embodiment 1.

Although not shown in the figures, it is effective to form a silicon film with a thickness approximately of from 2 to 20 nm below the first conductive film 119. This increases the adhesion of the conductive films formed on top, and can prevent oxidation.

The first conductive film 119 and the second conductive film 120 are etched in one shot, forming gate wirings 121 to 124 with a thickness of 400 nm. The gate wirings 122 and 123, formed in the control circuits, are formed at this time so as to overlap with a portion of the n-type impurity regions (b) 111 to 113 through the gate insulating film. The overlapping sections later become $L_{ov}$ regions. Note that the gate wiring 124 can be seen as two wirings in cross section, but it is actually formed from one pattern connected in series. (See FIG. 3C.)

An n-type impurity element (phosphorous in embodiment 1) is then doped in a self-aligning manner with the gate wirings 121 to 124 as masks. Doping of phosphorous is regulated so that impurity regions 125 to 130 thus formed have a concentration which is one-half to one-tenth that of the above n-type impurity regions (b) (typically between one-third and one-quarter). (However, the concentration is 5 to 10 times higher than the concentration of boron doped by the above channel doping process, typically between $1 \times 10^{16}$ and $5 \times 10^{18}$ atoms/cm$^3$, more typically from $3 \times 10^{17}$ to $3 \times 10^{18}$ atoms/cm$^3$.) Note that an impurity region containing an n-type impurity element at the above concentration range is defined as an n-type impurity region (c) throughout this specification. (See FIG. 3D.) In addition, phosphorous is doped by this process at a concentration of from $1 \times 10^{16}$ to $5 \times 10^{18}$ atoms/cm$^3$ in all of the n-type impurity regions (b), with the exception of areas covered with the gate wirings, but this is an extremely low concentration and therefore does not impart any influence on a function as the n-type impurity regions (b). Further, boron has already been doped at a concentration of between $1 \times 10^{15}$ and $1 \times 10^{18}$ atoms/cm$^3$ in the n-type impurity regions (b) 127 to 130 by the channel doping process, but phosphorous is doped at a concentration which is 5 to 10 times that of the boron contained in the p-type impurity regions (b), and therefore in this case as well boron may be thought to impart no influence on the function of the n-type impurity regions (b).

Strictly speaking, however, among the n-type impurity regions (b) 111 to 113, while the phosphorous concentration in the areas which overlap with the gate wirings remains as is at between $2 \times 10^{16}$ and $5 \times 10^{19}$ atoms/cm$^3$, there is an increase in the phosphorous concentration of between $1 \times 10^{16}$ and $5 \times 10^{18}$ atoms/cm$^3$ in the areas which do not overlap with the gate wirings, and phosphorous is contained in these areas at a slightly high concentration.

Figure 3A:
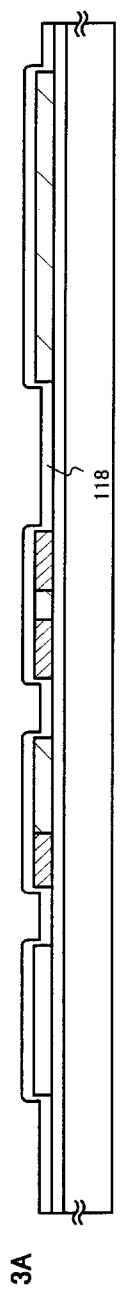
FIGS. 3A–3F show the manufacturing processes of the pixel section and the driver circuit.
Figure 3B:
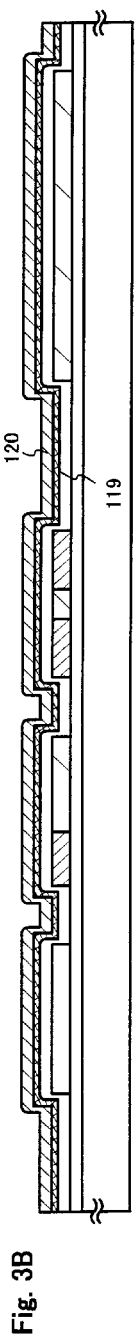
Figure 3C:
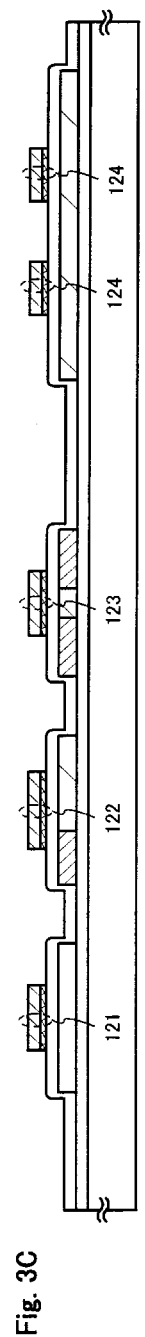
Figure 3D:
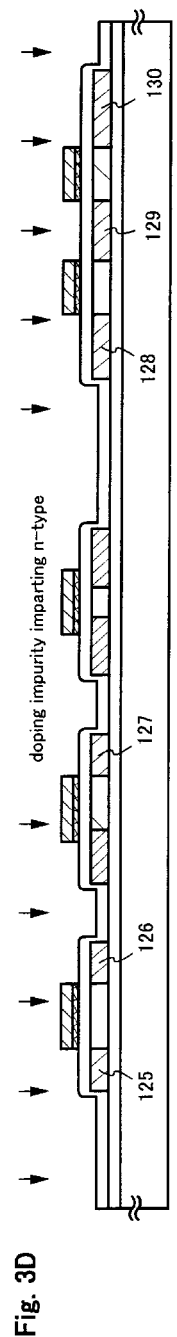
Figure 3E:
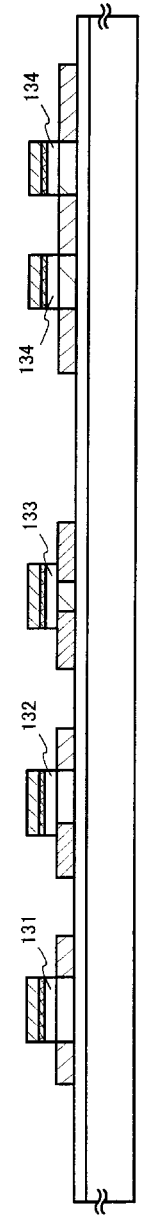
Figure 3F:
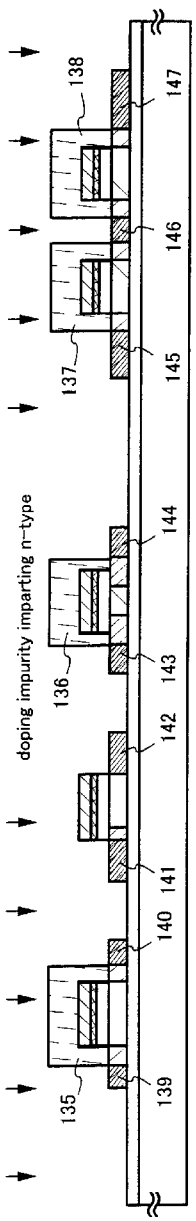

Further, it is effective to form a cap film (not shown) with a thickness of from 20 to 200 nm (preferably between 50 and 150 nm), covering the gate wirings, before doping the n-type impurity element in the process of FIG. 3C. An insulating film containing silicon can be used as the cap film. By forming the cap film, offset regions (not shown) having a width of between 20 and 200 nm (preferably from 50 to 150 nm) can be formed between the n-type impurity regions (c) formed here and the channel forming regions directly below the gate wirings. The offset regions are extremely effective in lowering the off current value of the TFTs.

The gate insulating film 118 is next etched in a self-aligning manner with the gate wirings 121 to 124 as masks. A dry etching method is used for the etching, and CHF$_3$ is used as an etching gas. It is not necessary to limit the etching gas to this, however. Gate insulating films 131 to 134 are thus formed under the gate wirings. (See FIG. 3E.) By thus exposing the active layers, the acceleration voltage can be reduced when next performing doping of an impurity element. The throughput is therefore increased because the necessary dosage is lowered. Of course, impurity regions may be formed by through doping with the gate insulating film remaining as is, unetched.

Resist masks 135 to 138 are formed next, covering the gate wirings, and an n-type impurity element (phosphorous in embodiment 1) is doped, forming impurity regions 139 to 147 containing a high concentration of phosphorous. Ion doping is also performed here (of course, ion implantation may also be used) using phosphine (PH$_3$), and the phosphorous concentration of these regions is between $1 \times 10^{20}$ and $1 \times 10^{21}$ atoms/cm$^3$ (typically from $2 \times 10^{20}$ to $5 \times 10^{21}$ atoms/cm$^3$). (See FIG. 3F.)

Note that an impurity region containing an n-type impurity element within the above concentration range is defined as an n-type impurity region (a) throughout this specification. Further, phosphorous, or boron, which has already been doped by a previous process is contained in the region in which the impurity regions 139 to 147 are formed, but phosphorous is doped at a sufficiently high concentration, and it may therefore be considered that there is no influence by the phosphorous or boron doped during by a previous process. Therefore, the impurity regions 139 to 147 may be called n-type impurity regions (a) throughout this specification.

The resist masks 135 to 139 are next removed, and a new resist mask 148 is formed. A p-type impurity element (boron in embodiment 1) is then doped, forming impurity regions 149 and 150 which contain a high concentration of boron. Boron is doped at a concentration of from $3 \times 10^{20}$ to $3 \times 10^{21}$ atoms/cm$^3$ (typically from $5 \times 10^2$ to $1 \times 10^{21}$ atoms/cm$^3$) by ion doping (ion implantation may, or course, be used) using diborane (B$_2$H$_6$). Note that an impurity region containing an p-type impurity element within the above concentration range is defined a an p-type impurity region (a) throughout this specification. (See FIG. 4A.)

Note that phosphorous is already doped at a concentration of from $1 \times 10^{20}$ to $1 \times 10^{21}$ atoms/cm$^3$ in a portion of the impurity regions 149 and 150 (the above n-type impurity regions (a) 139 and 140), but the boron concentration doped here is at least three times higher. Consequently, the previously formed n-type impurity regions are completely inverted into p-type, and function as p-type impurity regions. Therefore, the impurity regions 149 and 150 may be called p-type impurity regions (a) throughout this specification.

A first interlayer insulating film 151 is then formed after removing the resist mask 148. The first interlayer insulating film 151 may be formed of an insulating film containing silicon, specifically, a silicon nitride film, a silicon oxide film, a silicon nitride oxide film, or a laminate film of a combination of these films. The film thickness may be set from 100 to 400 nm. A 200 nm thick silicon nitride oxide film (where the nitrogen concentration is between 25 and 50 atom %), formed by plasma CVD using $SiH_4$, $N_2O$, and $NH_3$ as raw material gasses, is used in embodiment 1.

A heat treatment process is performed next in order to activate the n-type or p-type impurity element doped at respective concentrations. This process can be performed by furnace annealing, laser annealing, or by rapid thermal annealing (RTA). The activating process is performed by furnace annealing here. Heat treatment is performed in a nitrogen atmosphere at 300 to 650° C., preferably between 400 and 550° C., at 550° C. here, for 4 hours. (See FIG. 4B.)

In addition, heat treatment is performed in an environment containing between 3 and 100% hydrogen at 300 to 450° C. for 1 to 12 hours. Hydrogenation of the active layers is performed. This process is one of terminating dangling bonds in the semiconductor layers by thermally excited hydrogen. Plasma hydrogenation (using hydrogen excited by a plasma) may be performed as another means of hydrogenation.

A second interlayer insulating film 157 is formed with a thickness of from 500 nm to 1.5 μm on the first interlayer insulating film 151 after completion of the activation process. An 800 nm thick silicon oxide film is formed by plasma CVD as the second interlayer insulating film 157 in embodiment 1. A 1 μm thick interlayer insulating film is thus formed from a laminate film of the first interlayer insulating film (silicon nitride oxide film) 151 and the second interlayer insulating film (silicon oxide film) 157.

Note that it is also possible to use an organic resin film such as polyimide, acrylic, polyamide, polyimide amide, or BCB (benzocyclobutane) as the second interlayer insulating film 157.

Contact holes are then formed which reach the source region or the drain region of the respective TFTs, and source wirings 158 to 161, and drain wirings 162 to 165 are then formed. Note that, although not shown in the figures, the drain wirings 162 and 163 are connected as the same wiring in order to form the CMOS circuit. Further, although not shown in the figures, a laminate film with a three layer structure, in which a 100 nm Ti film, a 300 nm aluminum film which contains Ti, and another 150 nm Ti film are formed in succession by sputtering, is used as these wirings.

A 50 to 500 nm(typically between 200 and 300 nm) thick silicon nitride film, silicon oxide film, or silicon nitride oxide film is then formed as a passivation film 166. Plasma processing using a gas containing hydrogen, such as $H_2$ or $NH_3$, is performed in embodiment 1 at this point before film formation, and heat treatment is performed after film deposition. Excited hydrogen is supplied within the first and second interlayer insulating films by this preprocess. By performing heat treatment in this state, the film quality of the passivation film 166 is improved, and in addition, the hydrogen doped into the first and second interlayer insulating films diffuses in the base side, and therefore the active layers can effectively be hydrogenated.

Further, an additional hydrogenation process may be performed after the passivation film 166 is formed. For example, it is preferable to perform heat treatment in an atmosphere containing between 3 and 100% hydrogen for 1 to 12 hours at between 300 and 450° C., and a similar effect can be obtained by using plasma hydrogenation. Note that an opening in the passivation film 166 may be formed here in locations where contact holes will be formed later to connect to a pixel electrode and to drain wirings.

A third interlayer insulating film 167 is formed next from an organic resin with a thickness of approximately 1 μm. Materials such as polyimide, acrylic, polyamide, polyimide amide, and BCB (benzocyclobutane) can be used as the organic resin. The following can be given as the advantages of using an organic resin film: the film deposition method is simple; the specific dielectric constant is low, and therefore the parasitic capacitance can be reduced; and a flatness is superior. Note that organic resin films other than the ones stated above, and compounds such as an organic SiO can also be used. A thermally polymerized type polyimide is used here, and this is fired at 300° C. after application to the substrate.

Next, a shielding film 168 is formed on the third interlayer insulating film 167 in the region which becomes the pixel circuit. Note that the term shielding film is used throughout this specification with the meaning of shielding from both light and electromagnetic waves.

The shielding film 168 is formed with a thickness of between 100 and 300 nm from a film made up from an element chosen from aluminum (Al), titanium (Ti), and tantalum (Ta), or from a film having one of these elements as its principal constituent. A 125 nm thick aluminum film which contains 1 wt % titanium is formed in embodiment 1.

Note that if a 5 to 50 nm insulating film such as a silicon oxide film is formed on the third interlayer insulating film 167, then the adhesion of the shielding film formed on top of this can be increased. Further, if plasma processing using $CF_4$ gas is performed on the surface of the third interlayer insulating film 167, formed from an organic resin, then the adhesion of the shielding film formed on the third interlayer insulating film 167 can be increased due to an improved surface quality.

In addition, it is possible to form not only the shielding film, but also connecting wirings using an aluminum film containing titanium. For example, connecting wirings which connect circuits within the driver circuit can be formed. In this case, however, before depositing the material which forms the shielding film or the connection lines, it is necessary to form contact holes ahead of time in the third interlayer insulating film.

An oxide 169 is formed next on the surface of the shielding film 168 by anodic oxidation or plasma oxidation (anodic oxidation is used in embodiment 1) to a thickness of between 20 and 100 nm (preferably between 30 and 50 nm). A film with aluminum as its principal constituent is used in embodiment 1 as the shielding film 168, and therefore an aluminum oxide film (alumina film) is formed as the anodic oxide 169.

When performing anodic oxidation process, an ethylene glycol tartrate solution with a sufficiently small alkaline ion concentration is first manufactured. This is a solution in which a 15% aqueous solution of ammonium tartrate and ethylene glycol are mixed at a ratio of 2:8, and aqueous ammonia is added so that the pH is regulated to be 7±0.5. A platinum electrode is then formed in the solution as a cathode, the substrate on which the shielding film 168 has been formed is immersed in the solution, and a constant direct current (from several mA to several tens of mA) is applied with the shielding film 168 as an anode.

The voltage between the cathode and the anode in the solution changes with time in accordance with the growth of the anodic oxide. With a constant current, the voltage increases at a rate of 100 V/min, and the anodic oxidation process is stopped when the voltage reaches an arrival voltage of 45 V. The anodic oxide 169 can thus be formed with a thickness of approximately 50 nm in the surface of the shielding film 168. Further, the film thickness of the shielding film 168 becomes 90 nm as a result. Note that the numerical values related to the anodic oxidation shown here are only examples, and that they naturally can be changed to optimal values depending upon factors such as the size of the element being manufactured.

Furthermore, the structure here is taken in which the insulating film is formed only in surface of the shielding film by using anodic oxidation, but the insulating film may also be formed by a gas phase method such as plasma CVD, thermal CVD, or sputtering. In that case as well, it is preferable that the film thickness be of from 20 to 100 nm (preferably between 30 and 50 nm). Further, a silicon oxide film, a silicon nitride film, a silicon nitride oxide film, DLC (diamond like carbon film), or an organic resin film may also be used. In addition, a laminate film of a combination of these films may also be used.

Next, contact holes are formed in the third interlayer insulating film 167 and in the passivation film 166 which reach the drain wiring 165, and a pixel electrode 170 is formed. Note that pixel electrodes 171 and 172 are both pixel electrodes of separate pixels which are adjacent to each other. A transparent conductive film may be used for the pixel electrodes 170 to 172 when a transmission type liquid crystal display device is manufactured, and a metallic film may be used when a reflective type liquid crystal display device is manufactured. A transmission type liquid crystal display device is made here, and therefore an indium tin oxide (ITO) film with a thickness of 110 nm is formed by sputtering.

Further, at this point the pixel electrode 170 and the shielding film 168 overlap through the anodic oxide 169, forming a storage capacitance 173. Note that it is desirable to set the shielding film 168 to a floating state (an electrically isolated state) or to a fixed electric potential, preferably a common electric potential (the mid-point electric potential of the image signals sent as data).

The active matrix substrate having the driver circuit and the pixel circuit on the same substrate is thus completed. Note that in FIG. 4C, a p-channel TFT 301 and n-channel TFTs 302 and 303 are formed in the driver circuit, and a pixel TFT 304 is formed from an n-channel TFT in the pixel circuit.

A channel forming region 201, a source region 202, and a drain region 203 are each formed by p-type impurity regions (a) in the p-channel TFT 301 of the driver circuit. However, in practice, a region containing phosphorous at a concentration of between $1 \times 10^{20}$ and $1 \times 10^{21}$ atoms/cm$^3$ exists in a portion of the source region or of the drain region. Further, a catalytic element gettered by the process of FIG. 4B exists in that region at a concentration of $5 \times 10^{18}$ atoms/cm$^3$ or greater (typically from $1 \times 10^{19}$ to $5 \times 10^{20}$ atoms/cm$^3$).

In addition, a region 207 which overlaps a gate wiring through a gate insulating film is formed in the n-channel TFT 302 in a channel forming region 204, a source region 205, a drain region 206, and one side (the drain region side) of a channel forming region. (The region 207 is called an $L_{ov}$ region throughout this specification. Note that "ov" is attached to mean overlap.) The $L_{ov}$ region 207 contains phosphorous at a concentration of from $2 \times 10^{16}$ to $5 \times 10^{19}$ atoms/cm$^3$, and is formed so as to overlap all of the gate wiring.

Furthermore, a channel forming region 208, a source region 209, and a drain region 210 are formed in the n-channel TFT 303, and LDD regions 211 and 212 are formed in both sides of the channel forming region 208. Note that a portion of the LDD regions 211 and 212 are placed so as to overlap a gate wiring with this structure, and therefore regions ($L_{ov}$ regions) which overlap the gate wiring through a gate insulating film and regions which do not overlap the gate wiring are realized. (Regions which do not overlap the gate wiring are called $L_{off}$ regions throughout this specification. Note that "off" is attached to mean offset.)

Figure 6:
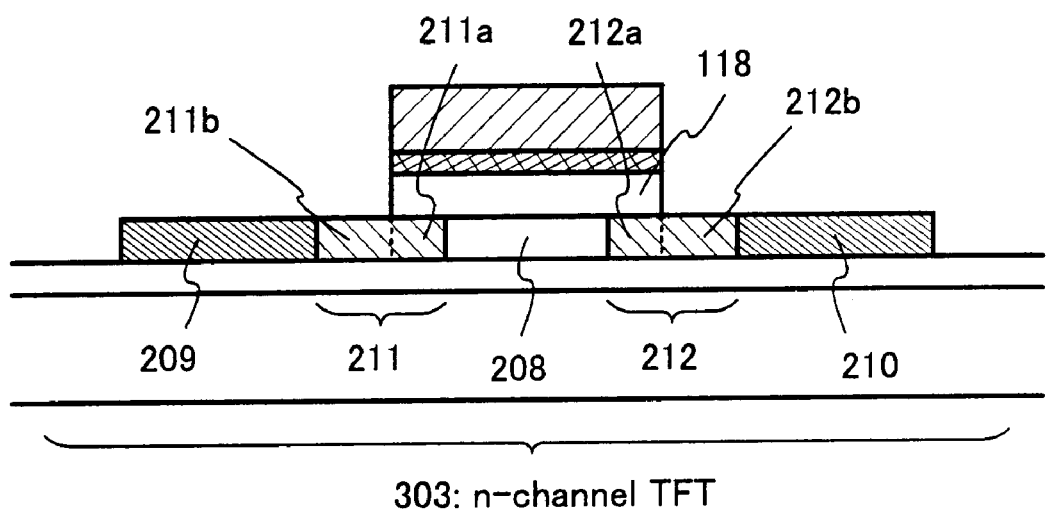
FIG. 6 shows an LDD structure of an n-channel TFT.

A cross sectional diagram shown in FIG. 6 is an enlarged diagram showing the state of the n-channel TFT 303 shown in FIG. 4C manufactured through the processes of FIG. 4B. As shown in the figure, the LDD region 211 can additionally be differentiated into an $L_{ov}$ region 211a and an $L_{off}$ region 211b. Further, phosphorous is contained in the $L_{ov}$ region 211a at a concentration of between $2 \times 10^{16}$ and $5 \times 10^{19}$ atoms/cm$^3$, but phosphorous is contained in the $L_{off}$ region 211b at between 1 and 2 times that concentration (typically from 1.2 to 1.5 times).

Further, channel forming regions 213 and 214, a source region 215, a drain region 216, $L_{off}$ regions 217 to 220, and an n-type impurity region (a) 221 contacting the $L_{off}$ regions 218 and 219 are formed in the pixel TFT 304. At this point the source region 215 and the drain region 216 are each formed by an n-type impurity region (a), and the $L_{off}$ regions 217 to 220 are formed by n-type impurity regions (c).

The structure of the TFTs forming each circuit is optimized in embodiment 1 depending on the circuit specifications required for the pixel circuit and the driver circuit, and the operation performance and the reliability of the semiconductor device can be increased. Specifically, by differing the placement of the LDD regions in the n-channel TFTs depending on the circuit specifications, and by proper use of an $L_{ov}$ region or an $L_{off}$ region, a TFT structure which places importance on high speed operation or hot carrier countermeasures, and a TFT structure which places importance on a low off current operation are realized on the same substrate.

For example, in the case of an active matrix type liquid crystal display device, the n-channel type TFT 302 is suitable for the driver circuits which place importance on high speed operation such as a shift register circuit, a frequency dividing circuit, a signal partitioning circuit, a level shifter circuit, and a buffer circuit. In other words, by placing the $L_{ov}$ region only on one side of the channel forming region (the drain side), this becomes a structure in which resistive components are reduced as much as possible and which places importance on hot carrier countermeasures. This is because the functions of the source region and the drain region do not change in the case of the above circuit group, and the carrier (electron) movement direction is fixed. However, $L_{ov}$ regions can be placed on both sides of the channel forming region when necessary.

Further, the n-channel TFT 303 is suitable for a sampling circuit (sample hold circuit) which places importance on both hot carrier countermeasures and low off current operation. In other words, hot carrier countermeasures are realized by placement of the $L_{ov}$ region, and in addition, low off current operation is realized by placement of the $L_{off}$ region. Further, the functions of the source region and the drain region of the sampling circuit invert and the carrier movement direction changes by 180, and therefore the structure must have linear symmetry around the gate wiring. Note that it may be possible to form only the $L_{ov}$ region depending upon the situation.

Further, the n-channel TFT 304 is suitable for the pixel circuit, the sampling circuit (sample hold circuit) which place importance on low off current operation. In other words, the $L_{ov}$ region, which can be a cause of increasing off current value, is not placed, and low off current operation is realized by placing only the $L_{off}$ region. Furthermore, by using an LDD region with a lower concentration than that in the LDD region of the driver circuit as an $L_{off}$ region, even if the on current value falls by a small amount, a countermeasure for thoroughly reducing the off current value is taken. In addition, it has been confirmed that the n-type impurity region (a) 221 is extremely effective in reducing the off current value.

The length (width) of the $L_{ov}$ region 207 of the n-channel TFT 302 may be of from 0.5 to 3.0 $\mu$m, typically between 1.0 and 1.5 $\mu$m, for channel length between 3 and 7 $\mu$m. Furthermore, the length (width) of the $L_{ov}$ regions 211a and 212a of the n-channel TFT 303 may be of from 0.5 to 3.0 $\mu$m, typically between 1.0 and 1.5 $\mu$m, and the length (width) of the $L_{off}$ regions 211b and 212b may be of from 1.0 to 3.5 $\mu$m, typically between 1.5 and 2.0 $\mu$m. In addition, the length (width) of the $L_{off}$ regions 217 to 220 formed in the pixel TFT 304 may be of from 0.5 to 3.5 $\mu$m, typically between 2.0 and 2.5 $\mu$m.

Additionally, the present invention is characterized in that the p-channel TFT 301 is formed in a self-aligning manner, and the n-channel TFTs 302 to 304 are formed in a non-self-aligning manner.

Further, by using an alumina film which has a high specific dielectric constant of from 7 to 9 as the dielectric of the storage capacitance in embodiment 1, it is possible to reduce the surface area to form the necessary capacitance. In addition, by making the shielding film formed on the pixel TFT into one electrode of the storage capacitance, as in embodiment 1, the aperture ratio of the image display section of the active matrix type liquid crystal display device can be increased.

Note that it is not necessary to place any limitations on the storage capacitance structure shown in embodiment 1 for the present invention. For example, the storage capacitance structures described in Japanese Patent Application No. Hei 9-316567 and Japanese Patent Application No. Hei 10-254097 can be used.

Embodiment 2

Figure 5:
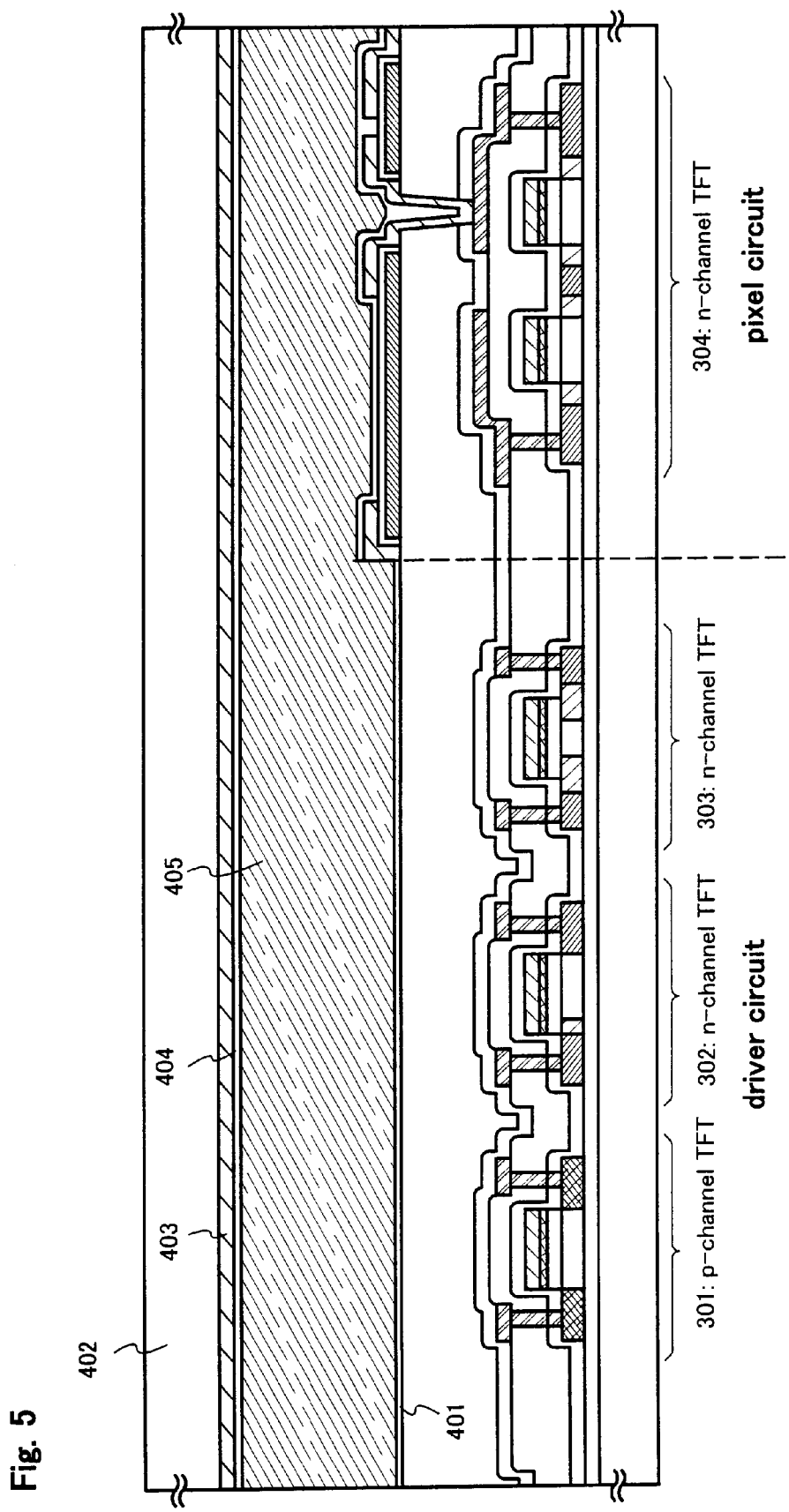
FIG. 5 is a cross sectional view of an active matrix liquid crystal display device.

A process of manufacturing an active matrix type liquid crystal display device from an active matrix substrate is explained in embodiment 2. An orientation film 401 is formed for a substrate in the state of FIG. 4C, as shown in FIG. 5. A polyimide film is used as the orientation film in embodiment 2. Further, a transparent conductive film 403 and an orientation film 404 are formed in an opposing substrate 402. Note that a color filter or a shielding film may be formed in the opposing substrate when necessary.

The after forming the orientation film, a rubbing process is performed next, orientating the liquid crystal molecules so that they possess a certain fixed pre-tilt angle. The active matrix substrate, on which the pixel circuit and the driver circuits are formed, and the opposing substrate are then joined together by a known cell construction process using a sealing material or spacers (both not shown). A liquid crystal 405 is then injected between both the substrates, and a complete seal is provided by using a sealant (not shown). A known liquid crystal material may be used for the liquid crystal. The active matrix type liquid crystal display device shown in FIG. 5 is thus completed.

Figure 7:
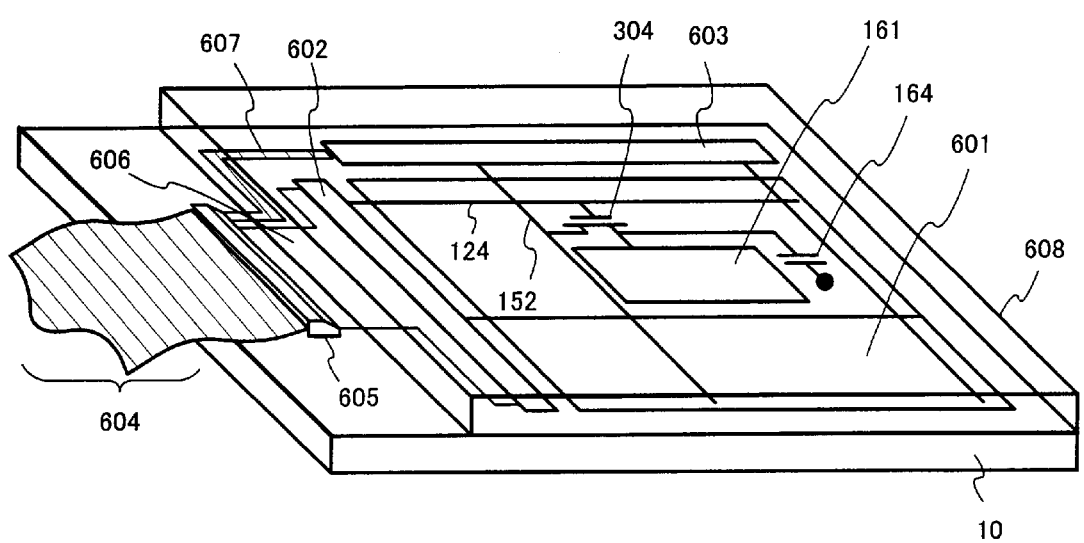
FIG. 7 is a perspective view of an active matrix liquid crystal display device.

The structure of the active matrix type liquid crystal display device is explained next using the perspective view of FIG. 7. Note that common symbols are used so as to correspond FIG. 7 to the cross sectional structure diagrams of FIGS. 1A to 4C. The active matrix substrate is structured by a pixel circuit 601, a scanning (gate) signal driver circuit 602, and an image (source) signal driver circuit 603 formed on the glass substrate 10. The pixel TFT 304 of the pixel circuit is an n-channel TFT, and the driver circuits formed in the periphery are structured based on CMOS circuits. The scanning signal driver circuit 602 and the image signal driver circuit 603 are connected to the pixel circuit 601 by the gate wiring 124 and a source wiring 152, respectively. Further, connection wirings 606 and 607 are formed for connecting from an external input-output terminal 605, which is connected to an FPC 604, to an input-output terminal of the driver circuits.

Embodiment 3

Figure 8:
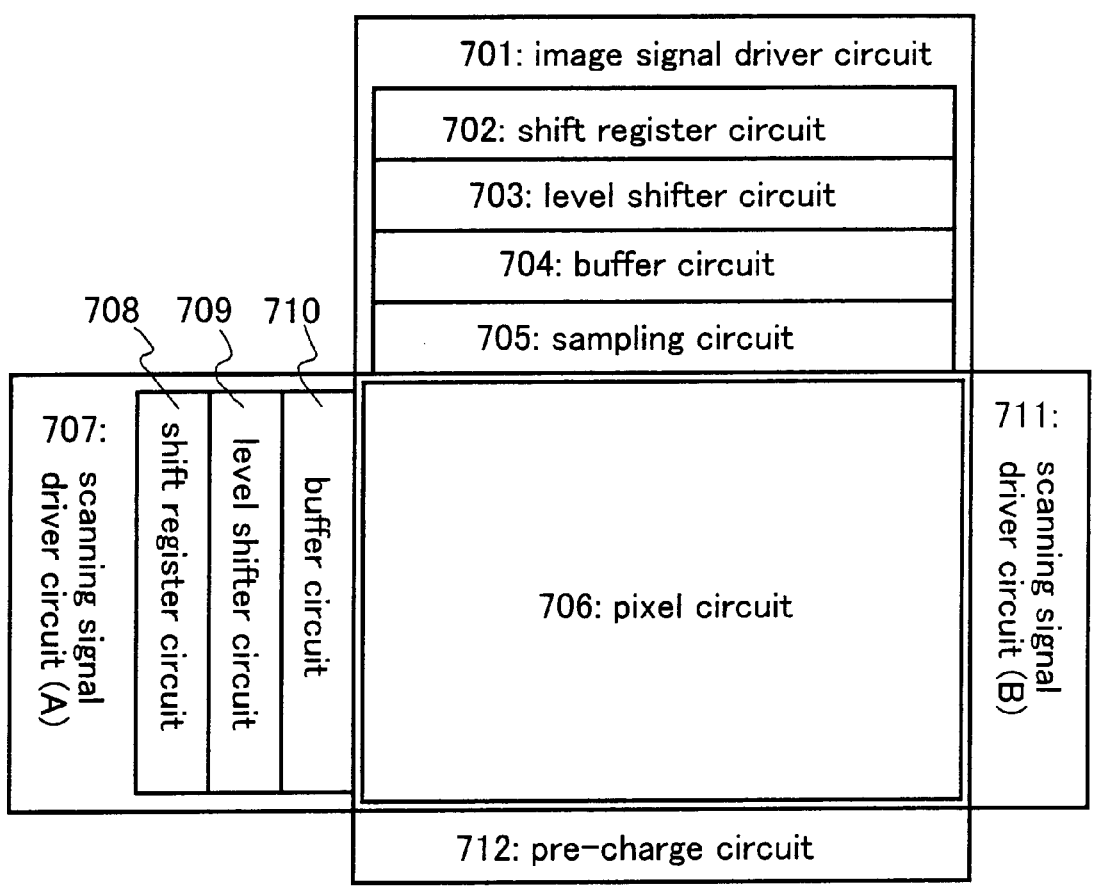
FIG. 8 is a circuit block diagram of an active matrix liquid crystal display device.

FIG. 8 shows an example of a circuit structure of the active matrix substrate shown in embodiment 2. The active matrix substrate of embodiment 3 has an image signal driver circuit 701, a scanning signal driver circuit (A) 707, a scanning signal driver circuit (B) 711, a pre-charge circuit 712, and a pixel circuit 706. Note that "driver circuit" is a generic term throughout this specification, and includes the image signal driver circuit 701 and the scanning signal driver circuit 707.

The image signal driver circuit 701 is provided with a shifter register circuit 702, a level shifter circuit 703, a buffer circuit 704, and a sampling circuit 705. Further, the scanning signal driver circuit (A) 707 is provided with a shift register circuit 708, a level shifter circuit 709, and a buffer circuit 710. The scanning signal driver circuit (B) 711 also is similarly structured.

The driving voltages of the shift register circuits 702 and 708 are between 5 and 16 V here (typically 10 V), and the structure denoted by 302, shown in FIG. 4C is suitable for the n-channel TFTs used in the CMOS circuits forming the circuits.

Further, the driving voltages of the level shifter circuits 703 and 709, and of the buffer circuits 704 and 710, become high at between 14 and 16 V, and similar to the shift register circuits, CMOS circuits containing the n-channel TFT 302 of FIG. 4C are suitable. Note that making the gate wiring into a multi-gate structure such as a double gate structure, or a triple gate structure, is effective in raising the reliability of each circuit.

Further, the driving voltage of the sampling circuit 705 is from 14 to 16 V, but it is necessary to reduce the off current value because the source region and the drain region invert, and therefore a CMOS circuit containing the n-channel TFT 303 of FIG. 4C is suitable. Note that only an n-channel TFT is shown in FIG. 4C, but in practice an n-channel TFT and a p-channel TFT are combined and formed when forming the sampling circuit.

Furthermore, the driving voltage of the pixel circuit 706 is between 14 and 16 V, and an off current value even lower than that of the sampling circuit 705 is required, and therefore it is preferable to use a structure in which the $L_{ov}$ region is not placed. It is preferable to use the n-channel TFT 304 of FIG. 4C for the pixel TFT.

Note that the structure of embodiment 3 can easily be realized by manufacturing the TFTs in accordance with the manufacturing processes shown in embodiment 1. Further, a structure which has a pixel circuit and a driver circuit is shown in embodiment 3, but it is possible to form other circuits such as a signal partitioning circuit, a frequency dividing circuit, a D/A converter circuit, an op-amp circuit, a γ compensation circuit, and in addition, signal processing circuits (these may be called logic circuits) such as a memory circuit and a microprocessor circuit, on the same substrate in accordance with the manufacturing processes of embodiment 1.

Thus the present invention can realize a semiconductor device containing at least a pixel circuit, and driver circuits for controlling the pixel circuit, on the same substrate. For example, a semiconductor device which is provided with a signal processing circuit, a driver circuit, and a pixel circuit on the same substrate can be realized.

Embodiment 4

In the manufacturing process shown in embodiment 1, an example is shown of controlling the threshold voltage by a channel doping process performed only in the region which becomes an n-channel TFT, but it is possible to perform the channel doping process over the entire surface without making a distinction between the n-channel TFT and a p-channel TFT. In this case, the number of photo masks in the manufacturing process is reduced, and therefore the process throughput and the yield can be increased.

Further, depending upon the circumstances, cases are possible in which the channel doping process is performed over the entire surface, and then an impurity element, which imparts a conductivity inverse to that of the impurity element doped into the entire surface, is doped into either the n-channel TFT or into the p-channel TFT.

Furthermore, the constitution of embodiment 4 can of course be implemented when manufacturing the active matrix type liquid crystal display device of embodiments 2 and 3.

Embodiment 5

In the manufacturing process examples shown in embodiments 1 and 2, there is a premise that the n-type impurity regions (b) which later function as $L_{ov}$ regions are formed in advance, before forming the gate wiring of the n-channel TFT. The manufacturing processes are characterized in that the p-type impurity regions (a) and the n-type impurity regions (c) are then formed in a self-aligning manner.

However, in order to obtain the effect of the present invention, the final structure may be like the structure shown in FIG. 4C, and there are no limitations placed upon processes leading up to that structure. Therefore, depending upon the circumstances, it is possible to form the p-type impurity regions (a) and the n-type impurity regions (c) by using a resist mask, and the process order can be freely changed by the operator.

Further, the constitution of embodiment 5 can of course be implemented when manufacturing the active matrix type liquid crystal display device of embodiments 2 and 3.

Embodiment 6

It is possible to use the present invention in forming an interlayer insulating film on a conventional MOSFET and then forming a TFT on top of that. In other words, it is possible to realize a semiconductor device with a three-dimensional structure. Further, it is possible to use an SOI substrate such as SIMOX, Smart-Cut (a registered trademark of SOITEC Corporation), or ELTRAN (a registered trademark of Cannon, Inc.) as the substrate.

Note that it is possible to freely combine the constitution of embodiment 6 with the constitution of any of embodiments 1 to 5.

Embodiment 7

It is possible to use various types of liquid crystal materials in a liquid crystal display device manufactured in accordance with the present invention. The following can be given as examples of the above liquid crystal material: a TN liquid crystal; PDLC (polymer diffusion type liquid crystal); FLC (ferroelectric liquid crystal); AFLC (an antiferroelectric liquid crystal); or a mixture of FLC and AFLC (an antiferroelectric mixed liquid crystal).

For example, it is possible to use the liquid crystal materials disclosed in: H. Furue, et al., "Characteristics and Driving Scheme of Polymer-stabilized Monostable FLCD Exhibiting Fast Response Time and High Contrast Ratio with Gray-Scale Capability", SID, 1998; T. Yoshida, et al., "A Full-color Thresholdless Antiferroelectric LCD Exhibiting Wide Viewing Angle with Fast Response Time", SID Digest, 841, 1997; S.Inui, et al., "Thresholdless antiferroelectricity in liquid crystals and its application to displays", J. Mater. Chem., 6(4), pp. 671–3, 1996; and U.S. Pat. No. 5,594,569.

In particular, among thresholdless antiferroelectric liquid crystals (abbreviated as TL-AFLC) that show electro-optical response characteristics in which the transmissivity changes continuously with the electric field, there are TL-AFLCs which show V-shape (or U-shape) electro-optical response characteristics, and those which have a driving voltage on the order of 2.5 V (a cell thickness of approximately from 1 to 2 $\mu$m) are found out. Therefore, there are cases when the power supply voltage used for the pixel circuit is in the range of from 5 to 8 V, and this suggests that it is possible to operate the driver circuits and the pixel circuit by the same power supply voltage. In other words, the entire liquid crystal display device can be made low power consumption.

Further, ferroelectric liquid crystals and antiferroelectric liquid crystals possess the advantage of a fast response speed relative to TN liquid crystals. Extremely high speed operation TFTs are realized for the TFTs used for the present invention, and therefore it is possible to realize a liquid crystal display device with a fast image response speed which sufficiently makes use of the fast response speed of the ferroelectric liquid crystals and the antiferroelectric liquid crystals.

Further, the spontaneous polarization of a thresholdless antiferroelectric mixed liquid crystal is large in general, and the dielectric constant of the liquid crystal itself is high. Thus a relatively large storage capacitance is necessary for the pixel when a thresholdless antiferroelectric mixed liquid crystal is used for a liquid crystal display device. Therefore it is desirable to use a thresholdless antiferroelectric mixed liquid crystal that has a small spontaneous polarization. For that reason, the storage capacitance shown in FIG. 40 of embodiment 1 can store a large capacity with a small surface area, and this is preferable.

Note that it is, of course, effective to use the liquid crystal display device of embodiment 7 as a display for electronic equipment such as a personal computer.

Further, it is possible to freely combine the constitution of embodiment 7 with the constitution of any of embodiments 1 to 6.

Embodiment 8

It is possible to apply the present invention in an active matrix type EL display. An example of this is shown in FIG. 9.

Figure 9:
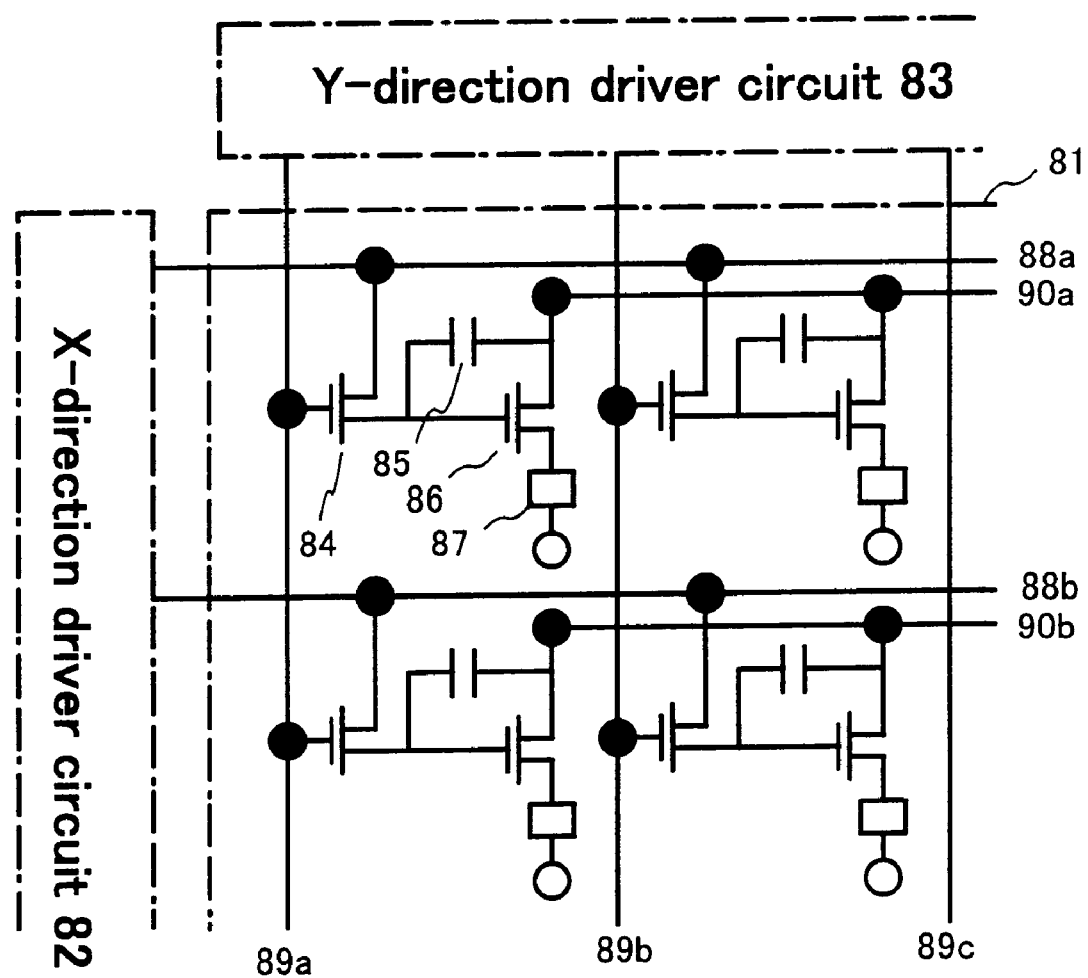
FIG. 9 is a diagram showing the structure of an active matrix E1 display device.

FIG. 9 is a circuit diagram of an active matrix type EL display. Reference numeral 81 denotes a pixel circuit, and an x-direction driver circuit 82 and a y-direction driver circuit 83 are formed in the periphery of the pixel circuit. Further, each pixel of the pixel circuit 81 has a switching TFT 84, a capacitor 85, a current controlling TFT 86, and an organic EL element 87, and an x-direction signal line 88a (or 88b), and a y-direction signal line 89a (or 89b, or 89c) are connected to the switching TFT 84. Furthermore, power supply lines 90a and 90b are connected to the current controlling TFT 86.

In the active matrix type EL display of embodiment 8, the TFTs used in the x-direction control circuit 82, the y-direction control circuit 83, or the current controlling TFT 86 are formed by a combination of the p-channel TFT 301 and the n-channel TFTs 302 or 303 of FIG. 4C. In addition, the TFT of the switching TFT 84 is formed by the n-channel TFT 304 of FIG. 4C.

Note that a combination of the constitutions of any of embodiment 1, and embodiments 3 to 7, may be used for the active matrix EL display of embodiment 8.

Embodiment 9

CMOS circuits and pixel section fabricated in accordance with the present invention can be utilized in various electrooptical devices (active matrix liquid crystal display, active matrix EL display, active matrix EC display). Namely, the present invention can be used in all of the electronic devices incorporating these electrooptical devices for the display section.

Following can be given as such electronic devices: a video camera; a digital camera; a projector (rear type or front type); a head mounted display (goggle type display); a car navigation system; a car stereo; a personal computer; a portable information terminal (mobile computer, portable telephone or electronic book etc.). One example of these are shown in FIGS. 10A to 10F, 11A to 11D and 12A to 12C.

Figure 10A:
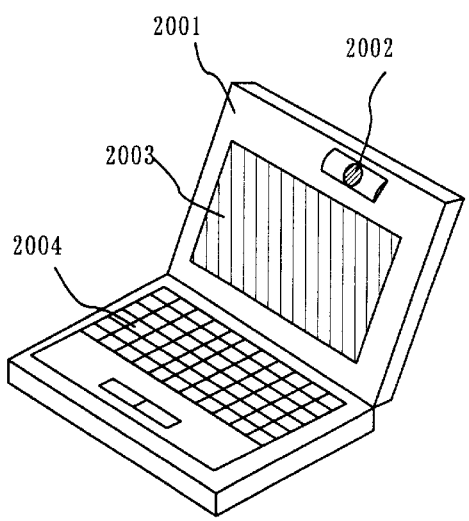
FIGS. 10A–10F show an example of electronic devices.

FIG. 10A is a personal computer, and comprises a main body 2001, an image input section 2002, a display device 2003 and a key board 2004. The present invention can be applied to the image input section 2002, display device 2003 and other signal control circuits.

Figure 10B:
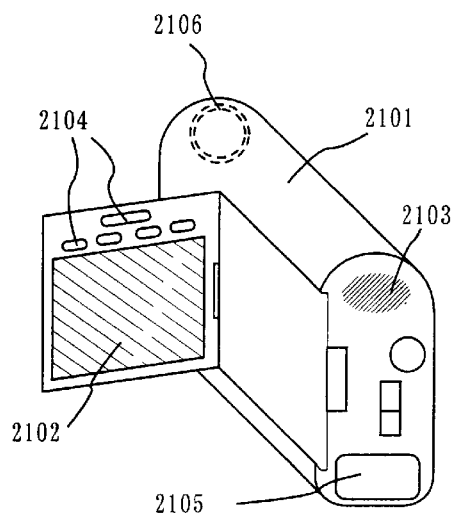

FIG. 10B is a video camera and comprises a main body 2101, a display device 2102, a voice input section 2103, operation switches 2104, a battery 2105 and an image receiving section 2106, etc. The present invention can be applied to the display device 2102 and other signal control circuits.

Figure 10C:
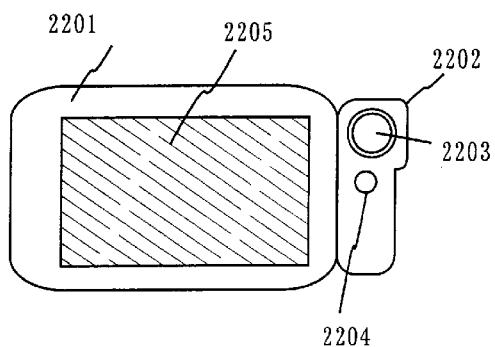

FIG. 10C is a mobile computer and comprises a main body 2201, a camera section 2202, an image receiving section 2203, operation switches 2204 and a display device 2205, etc. The present invention can be applied to the display device 2205 and other signal control circuits.

Figure 10D:
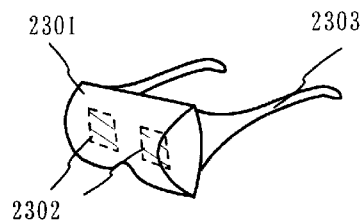

FIG. 10D is a goggle type display and comprises a main body 2301, a display device 2302, an arm section 2303, etc. The present invention can be applied to the display device 2302 and other signal control circuits.

Figure 10E:
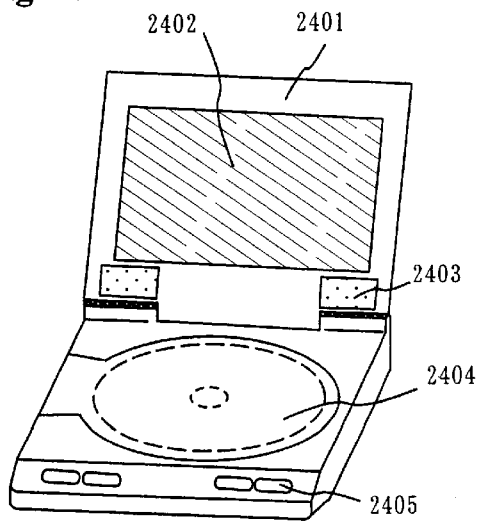

FIG. 10E is a player using a recording medium which records a program (hereinafter referred to as recording medium) and comprises a main body 2401, a display device 2402, a speaker section 2403, a recording medium 2404 and operation switches 2405, etc. This player can operate music appreciation, film appreciation, games and the use for internet by using DVD (digital versatile disc), CD etc. for the recording medium. The present invention can be applied to the display device 2402 and other signal control circuits.

Figure 10F:
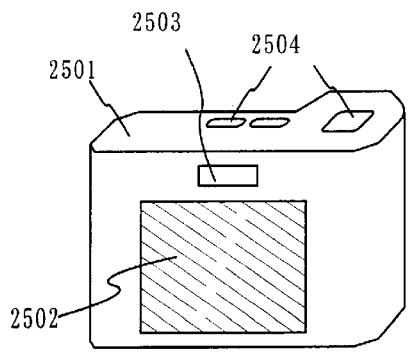

FIG. 10F is a digital camera and comprises a main body 2501, a display device 2502, a view finder section 2503, operation switches 2504, and image receiving section (not shown), etc. The present invention can be applied to the display device 2502 and other signal control circuits.

FIG. 11A is a front type projector and comprises a projection system 2601, a screen 2602 etc. The present invention can be applied to a liquid crystal display device 2808 which comprises a part of the projection system 2601 and other signal control circuits.

FIG. 11B is a rear type projector and comprises a main body 2701, a projection system 2702, a mirror 2703 and a screen 2704, etc. The present invention can be applied to a liquid crystal display device 2808 which comprises a part of the projection system 2702 and other signal control circuits.

FIG. 11C is a diagram showing an example of the structure of projection systems 2601 and 2702 of FIGS. 11A and 11B. Projection systems 2601 and 2702 comprise an optical light source system 2801, mirrors 2802 and 2804 to 2806, a dichroic mirror 2803, a prism 2807, a liquid crystal display device 2808, a phase differentiation plate 2809 and a projection optical system 2810. The projection optical system 2810 is structured from an optical system which comprises a projection lens. Though the present embodiment shows an example of 3-plate type, it is not limited to this structure for example it may be a single plate type. Further, the operator may suitably provide an optical system such as an optical lens, a film having polarizing function, a film for adjusting phase difference and an IR film in the path of light shown by an arrow in FIG. 11C.

FIG. 11D is a diagram showing an example of the structure of optical light source system 2801 in FIG. 11C. In the present embodiment, the optical light source system comprises a reflector 2811, a light source 2812, lens arrays 2813 and 2814, a polarization inversion element 2815 and a condensing lens 2816. Further, the operator may suitably provide an optical system such as an optical lens, a film having polarizing function, a film for adjusting phase difference and an IR film in the path of light shown by an arrow in FIG. 11C.

Note that the projectors shown in FIGS. 11A and 11B show the cases when a transmissive type electrooptical device is used, and application examples in reflection type electrooptical devices and EL display devices are not shown in the figures.

Figure 12A:
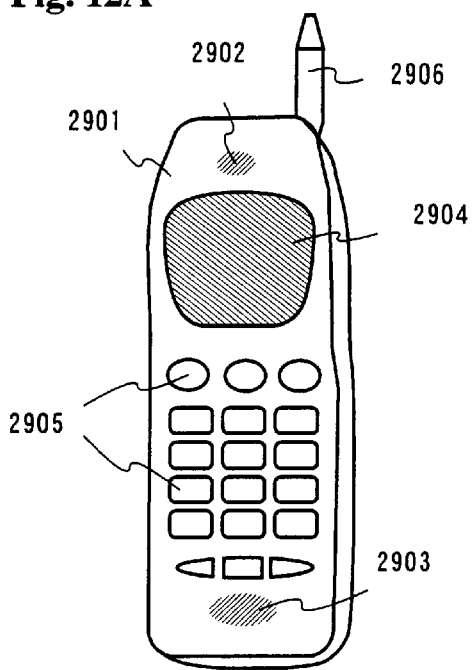
FIGS. 12A–12C show an example of electronic devices.

FIG. 12A is a portable telephone and comprises a main body 2901, a voice output section 2902, a voice input section 2903, a display device 2904, operation switches 2905 and an antenna 2906, etc. The present invention can be applied to the voice output section 2902, the voice input section 2903, the display device 2904 and other signal control circuits.

Figure 12B:
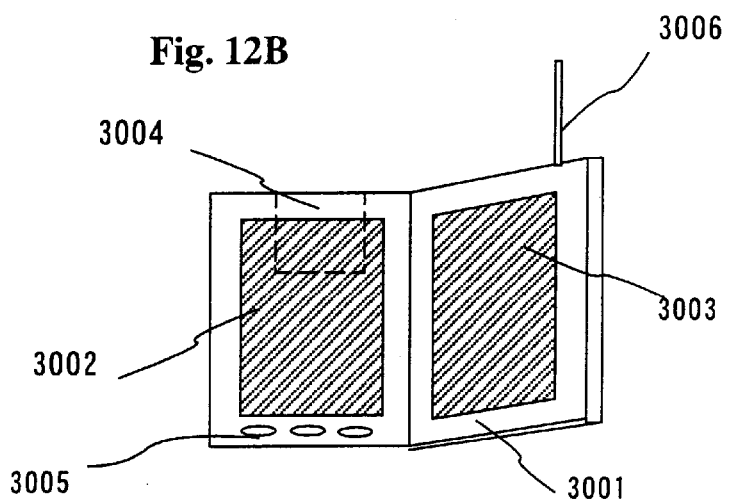

FIG. 12B is a portable book (electronic book) and comprises a main body 3001, a display device 3002 and 3003, a recording medium 3004, operation switches 3005 and an antenna 3006, etc. The present invention can be applied to the display devices 3002 and 3003, and other signal control circuits.

Figure 12C:
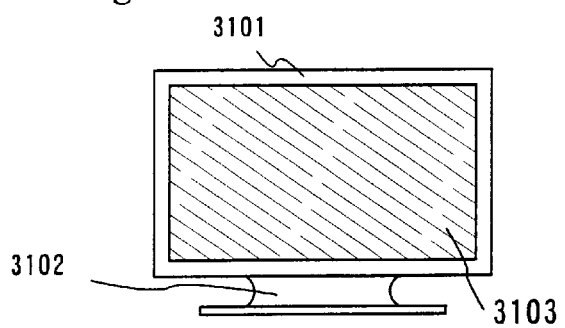

FIG. 12C is a display and comprises a main body 3101, a supporting section 3102 and a display device 3103 etc. The present invention can be applied to the display device 3103. The display of the present invention is specifically advantageous in case of a large display and advantageous in diagonal 10 inches or over (more specifically 30 inches or over).

As stated above, the applicable range of the present invention is very large, and it can be applied to electronic devices of various areas. The electronic devices of the present embodiment can be realized by structures combining any of Embodiments 1 to 8.

Manufacture of good quality crystalline semiconductor film usable for the active layer of TFT by simple processes became possible by using the present invention. Such TFTs can be used in various semiconductor devices (concretely electrooptical devices here).

Further, the present invention is effective for semiconductor devices having such electrooptical devices as a display medium (concretely electronic devices here).

What is claimed is:

1. A method for manufacturing a semiconductor device comprising the steps of:
   forming an amorphous semiconductor film comprising silicon over a substrate;
   introducing Cu into the amorphous semiconductor film which promotes crystallization of the amorphous semiconductor film;
   crystallizing the amorphous semiconductor film by heat treatment; and
   applying a liquid in contact with the semiconductor film thereby reducing the Cu which promotes crystallization.

2. A method according to claim 1 wherein the introduction of Cu is performed by spin coating of a liquid over the amorphous semiconductor film.

3. A method according to claim 1 wherein a liquid used for the introduction of Cu is an aqueous solution which includes 0.01 to 0.1% by weight of HCl and 1 to 1000 ppm by weight of $CuCl_2$.

4. A method according to claim 1 wherein the introduction of Cu is performed by sputtering.

5. A method according to claim 1 wherein the semiconductor film crystallized by the step of crystallizing the amorphous semiconductor film by heat treatment is characterized as a polycrystalline semiconductor film having crystal grain boundaries.

6. A method according to claim 1 wherein the liquid applied in the step of applying a liquid in contact with the semiconductor film includes at least one of the chemical solutions selected from a group consisting of a chemical solution including oxygen namely sulfuric acid, nitric acid, oxalic acid and nitrohydrochloric acid.

7. A method according to claim 1 wherein the liquid applied in the step of applying a liquid in contact with the semiconductor film includes at least one of the chemical solutions selected from a group consisting of a chemical solution not including oxygen namely hydrochrolic acid and hydrofluoric acid.

8. A method according to claim 1 wherein sulfuric acid at temperature 250° C. or over for the liquid applied in the step of applying a liquid in contact with the semiconductor film.

9. A method according to claim 1 further comprising a step of removing an oxide film on a surface of the semiconductor film before the step of applying a liquid in contact with the semiconductor film.

10. A method according to claim 1 wherein the semiconductor device is a personal computer.

11. A method according to claim 1 wherein the semiconductor device is a video camera.

12. A method according to claim 1 wherein the semiconductor device is a mobile computer.

13. A method according to claim 1 wherein the semiconductor device is a goggle type display.

14. A method according to claim 1 wherein the semiconductor device is a player comprising a recording medium.

15. A method according to claim 1 wherein the semiconductor device is a digital camera.

16. A method according to claim 1 wherein the semiconductor device is a front type projector.

17. A method according to claim 1 wherein the semiconductor device is a rear type projector.

18. A method according to claim 1 wherein the semiconductor device is a portable telephone.

19. A method according to claim 1 wherein the semiconductor device is an electronic book.

20. A method according to claim 1 wherein the semiconductor device is a display.

21. A method for manufacturing a semiconductor device comprising a plurality of thin film transistors comprising the steps of:
   forming an amorphous semiconductor film comprising silicon over a substrate;
   introducing Cu into the amorphous semiconductor film which promotes crystallization of the amorphous semiconductor film;
   crystallizing the amorphous semiconductor film by heat treatment;
   applying a liquid in contact with the semiconductor film thereby reducing the Cu which promotes crystallization;
   forming island semiconductor layers by patterning the semiconductor film;
   forming a first resist mask on the semiconductor film;
   doping an impurity element imparting n-type conductivity;
   forming a gate insulating film over the island semiconductor layers; and
   forming a gate wiring over the island semiconductor layers.

22. A method according to claim 21 wherein the introduction of Cu is performed by spin coating of a liquid over the amorphous semiconductor film.

23. A method according to claim 21 wherein a liquid used for the introduction of Cu is an aqueous solution which includes 0.01 to 0.1% by weight of HCl and 1 to 1000 ppm by weight of $CuCl_2$.

24. A method according to claim 21 wherein the semiconductor device is one selected from a group consisting of personal computer, video camera, mobile computer, goggle type display, player comprising a recording medium, digital camera, front type projector, rear type projector, portable telephone, electronic book and display.

25. A method for manufacturing a semiconductor device comprising a plurality of thin film transistors comprising the steps of:
   forming an amorphous semiconductor film comprising silicon over a substrate;
   introducing Cu into the amorphous semiconductor film which promotes crystallization of the amorphous semiconductor film;
   crystallizing the amorphous semiconductor film by heat treatment;
   applying a liquid in contact with the semiconductor film thereby reducing the Cu which promotes crystallization;
   irradiating a laser light onto the semiconductor film;
   forming a first resist mask over a part of the semiconductor film;
   doping an impurity element imparting n-type conductivity;

forming island semiconductor layers by patterning the semiconductor film;

forming a gate insulating film over the island semiconductor layers; and forming a gate wiring over the island semiconductor layers.

26. A method according to claim 25 wherein the introduction of Cu is performed by spin coating of a liquid over the amorphous semiconductor film.

27. A method according to claim 25 wherein a liquid used for the introduction of Cu is an aqueous solution which includes 0.01 to 0.1% by weight of HCl and 1 to 1000 ppm by weight of $CuCl_2$.

28. A method according to claim 25 wherein the semiconductor device is one selected from a group consisting of personal computer, video camera, mobile computer, goggle type display, player comprising a recording medium, digital camera, front type projector, rear type projector, portable telephone, electronic book and display.

29. A method for manufacturing a semiconductor device comprising an active matrix display comprising CMOS circuit and a pixel section comprising the steps of:

forming an amorphous semiconductor film comprising silicon over a substrate;

introducing Cu into the amorphous semiconductor film which promotes crystallization of the amorphous semiconductor film;

crystallizing the amorphous semiconductor film by heat treatment;

applying a liquid in contact with the semiconductor film thereby reducing the Cu which promotes crystallization;

forming island semiconductor layers by patterning the semiconductor film;

forming a first resist mask over a part of the island semiconductor layers;

doping an impurity element imparting n-type conductivity;

forming a gate insulating film over the island semiconductor layers;

forming a gate wiring over the island semiconductor layers;

doping an impurity element imparting n-type conductivity;

forming a second resist mask over a part of the island semiconductor layers;

doping an impurity element imparting n-type conductivity;

forming a third resist mask over a part of the island semiconductor layers; and doping an impurity element imparting p-type conductivity.

30. A method according to claim 29 wherein the introduction of Cu is performed by spin coating of a liquid over the amorphous semiconductor film.

31. A method according to claim 29 wherein a liquid used for the introduction of Cu is an aqueous solution which includes 0.01 to 0.1% by weight of HCl and 1 to 1000 ppm by weight of $CuCl_2$.

32. A method according to claim 29 wherein the semiconductor device is one selected from a group consisting of personal computer, video camera, mobile computer, goggle type display, player comprising a recording medium, digital camera, front type projector, rear type projector, portable telephone, electronic book and display.

* * * * *